United States Patent [19]

Roza et al.

[11] 4,210,882
[45] Jul. 1, 1980

[54] DELAY NETWORK COMPRISING A CHAIN OF ALL-PASS SECTIONS

[75] Inventors: Engel Roza; Johannes O. Voorman, both of Eindhoven, Netherlands

[73] Assignee: U.S. Philips Corporation, New York, N.Y.

[21] Appl. No.: 859,643

[22] Filed: Dec. 12, 1977

[30] Foreign Application Priority Data

Sep. 2, 1977 [NL] Netherlands .......................... 7709663

[51] Int. Cl.² .................... H03H 7/28; H03H 7/30; H03H 7/10; H03H 7/22
[52] U.S. Cl. .................................... 333/166; 330/303; 333/138; 333/139
[58] Field of Search ............... 333/29, 70 T, 138, 139, 333/166; 307/262, 293, 294; 330/303, 126

[56] References Cited

U.S. PATENT DOCUMENTS

| | | |
|---|---|---|
| 3,614,645 | 10/1971 | Wheatley, Jr. ........................ 330/255 |
| 3,922,614 | 11/1975 | van de Plassche ................... 330/257 |
| 3,995,235 | 11/1976 | Kaplan ............................ 307/262 X |
| 4,049,977 | 9/1977 | Radovsky ............................ 307/262 |

*Primary Examiner*—Alfred E. Smith
*Assistant Examiner*—Marvin Nussbaum
*Attorney, Agent, or Firm*—Thomas A. Briody; Jack Oisher; James J. Cannon, Jr.

[57] ABSTRACT

A delay network, having a chain of all-pass sections, each comprising two separate branches, a resistive and a capacitive branch, which terminate in amplifiers with negligible signal consumption whose output signals are combined. This enables an analog delay network to be realized in integrated circuit technology.

9 Claims, 13 Drawing Figures

DELAY NETWORK COMPRISING A CHAIN OF ALL-PASS SECTIONS

BACKGROUND OF THE INVENTION

The invention relates to an electrical delay network comprising a chain of a plurality of (at least three) all-pass sections with constant amplitude response and mutually identical phase response as a function of the frequency. In addition to delay purposes, such a network is frequently also used as an electrical filter network, whose frequency response can be adjusted electrically by simple means. In this respect the trend in recent years is towards digitally controlled and operated filters, for example transversal filters, comprising a chain of clock-pulse controlled memory sections, whose tappings lead to a summing device via weighting factor adjusting means. Thus, this summing device adds the original signal to time-delayed signals, yielding an output signal whose amplitude and phase (i.e. the characteristic) can be adjusted electrically with the aid of the weighting factor adjusting means. Such filters can satisfactorily be realized with the aid of integrated circuits and are suitable for a wide field of applications owing to their adjustability, a desired adjustment being obtainable by means of a programmable read-only memory (ROM).

Nevertheless, such filters exhibit some drawbacks, which prohibit their general use in radio and television receivers. For example, not only a source of clock pulses is needed, but generally this source should also be capable of supplying substantial power, in order to shift the signal along the chain of memory sections with the required reliability and accuracy. Moreover, the clock frequency, which determines the maximum signal frequency that can be processed, cannot be varied without the risk of variable signal degredation.

The invention aims at a different approach, which is based on theories about so-called "ortho-normal" functions (see for example Y. W. Lee, Statistical Theory of Communication, 1960, chapter 19). As an example, one of the applications of an electrical network in accordance with the invention is that in which the chain of all-pass sections comprises tappings on which, owing to the use of weighting-factor adjusting means, adjustable signals are available, which by summation yield a transfer characteristic of the total network which is dependent on the adjustable weighting factors.

Such networks also add the signal to the delayed signals, while the weighting factor adjusting means provide separate signal processing without or substantially without any interaction owing to the orthonormality, so that again a wide range of frequency characteristics can be obtained. The invention is based on the recognition that such networks can also be realized in integrated circuit technology, provided that certain requirements are met.

SUMMARY OF THE INVENTION

The invention is characterized in that the all-pass sections which are integrated on a semiconductor body each comprise two branches, the first branch with a resistive element (resistive branch), the second branch with a capacitive element (capacitive branch), an electrical input signal being applied to an input terminal of such a section and splitting into a first and second signal component for each of said branches, while the first signal component is applied to the input of the first semiconductor amplifier which exhibits negligible signal consumption via at least one resistor, and the second signal component is applied to the input of a second semiconductor amplifier which exhibits negligible signal consumption via at least one capacitor, after which the electrical output signals of the first and, second amplifiers are combined and—except for the last section of the chain,—are applied to an input terminal of a subsequent section.

In principle, signal splitting can be achieved in that a signal voltage is applied to the series connection of the two branches, which branches in the simplest form consist of a resistor or a capacitor, the voltage component across the first branch (the resistor) being applied to a first amplifier with negligible input admittance, the voltage component across the second branch (the capacitor) to a second amplifier which also has a negligible input admittance, after which the output currents or voltages of these amplifiers are combined. These amplifiers then consume a negligible amount of signal power, so that the retro-action to the two branches is negligible. Special attention must then be paid to parasitic effects, because of the fact that the two voltages components appear across floating impedances, so that parasitic leakage resistances or capacitances can have an adverse effect.

Therefore, the embodiments described with reference to the drawing, will mainly employ solutions in accordance with which a signal current is applied to the parallel connection of the first and the second branch and the signal-component currents thus produced are passed through the first and the second amplifier with negligible input impedance respectively.

DESCRIPTION OF THE PREFERRED EMBODIMENTS

Figure 1:
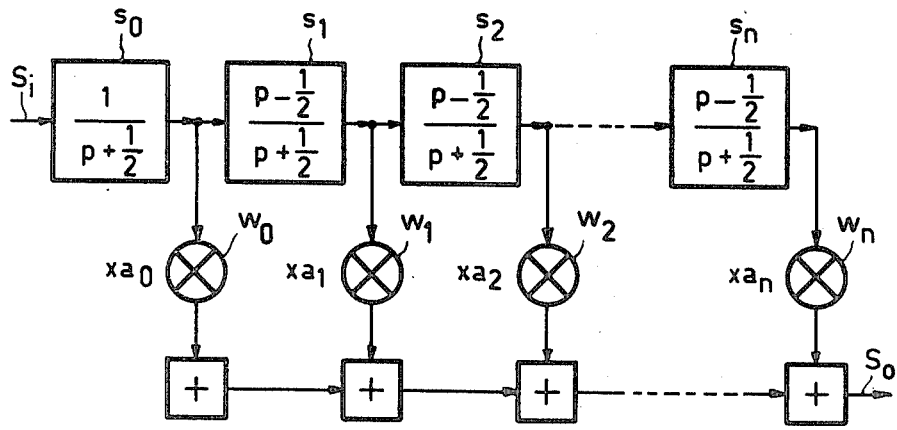
FIG. 1 shows the general circuit design of a transversal filter.
Figure 2:
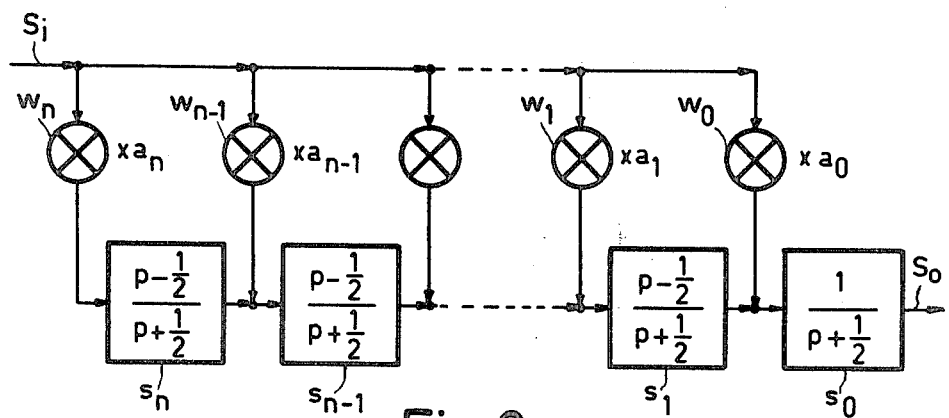
FIG. 2 shows a variant of FIG. 1.

FIG. 1 schematically shows the circuit arrangement of a known transversal filter. An input signal $S_i$ is applied to a chain of all-pass sections $s_1, s_2 \ldots s_r$ with constant amplitude response and identical phase response characteristics, which may be represented by the transfer function $$\frac{p-\frac{1}{2}}{p+\frac{1}{2}},$$

where p represents the complex frequency H+jω(H)=the damping, ω the angular frequency). The chain is preceded by a section $s_o$ with a transfer function $(1/p+\frac{1}{2})$ so as to obtain an orthognal pulse response at the tappings, but this section is not necessary under all conditions. Weighting factor adjusting means $w_0, w_1, w_2 \ldots w_n$ act on the tappings of the chain, which means multiply the tapped signal by values $a_0, a_1, a_2 \ldots a_n$, after which the output signals of said adjusting means $w_o \ldots w_n$ are added and yield the output signal $S_o$. As a variant the input signal $S_i$ may be applied to tappings on the chain of sections $s_o \ldots s_n$ (see FIG. 2), after which this chain performs the summing function, so as to supply the output signal $S_o$. In either case the contribution to $S_o$ by the $k^{th}$ weighting factor adjusting means $w_k$ is given by $$\frac{(p-\frac{1}{2})^k}{(p+\frac{1}{2})^{k+1}} \cdot a_k.$$

Thus a filter is obtained whose transfer characteristic can be varied at option by means of the weighting factor adjusting means, while owing to the orthogonality of the pulse responses via the different paths there is no risk of interaction of said weighting factor adjusting means with the transmission of the complete filter. However, it will be evident that if the chain of sections $s_o \ldots s_r$ is to be used for delay purposes only, all or part of the weighting factor adjusting means $w_o \ldots w_n$ may be dispensed with.

When realizing transversal filters more attention has been paid so far to versions which comprise clock-pulse controlled delay sections with tappings from which the time delay signals are taken, which are adjusted to the desired magnitude with the aid of weighting factor adjusting means and are subsequently added. Such transversal filters are generally realized in integrated circuit technology; however, they cannot be realized in conventional integration processes, by means of which other circuits are also integrated (standard integration processes), but for this purpose special processes had to be developed. Thus, filters of very small dimensions could be obtained. In respect of the analog filter described in the foregoing the integration possibilities have not been recognized until now. The invention is based on the recognition that such integration possibilities definitely exist, even by standard integration processes, provided that certain requirements are met, so that all kinds of parasitic side effects are eliminated. It is then possible to manufacture the above-mentioned circuits together with other circuits (even on one semiconductor body). These and other circuits may moreover provide an external programming facility for the adjusting means. This substantially widens the field of application to include adaptive filters.

It is known, that for realizing the transfer function $$\frac{p-\frac{1}{2}}{p+\frac{1}{2}}$$

of one section, use can be made of an amplifier with two outputs, which carry signal voltages in phase opposition, one output being connected to a common point via a resistor, the other via a capacitor, the desired output signal then appearing on said common point. However, this solution is not suitable for integration, because the parasitic impedances which then occur affect the desired transfer function.

In accordance with the invention, the sections comprise two isolated branches, the first with a resistive element, the second with a capacitive element, which branches terminate in amplifiers with negligible signal consumption, after which the output signals of these amplifiers are combined so as to be applied to the next section.

Figure 3:
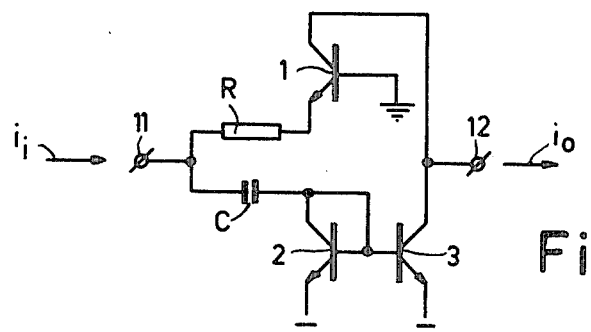
FIGS. 3 and 4 show two examples of sections for use in a network in accordance with the invention.

FIG. 3 shows a very simple design of such a section. The input signal current $i_i$ is applied to an input terminal 11 of the section and then divides between two branches, the first (resistive branch) comprising a resistor R and a non-inverting current amplifier 1, the second (capacitive branch) comprising a capacitor C and an inverting current amplifier 2–3, which in the present example takes the form of a current mirror. Owing to the low input impedances of the amplifiers 1 and 2–3 respectively, the signal power consumption by these amplifiers is negligible, while moreover parasitic impedances leave the desired resistive or capacitive elements of the two branches substantially unaffected. The amplifier 1 then takes the form of a transistor amplifier with grounded base and emitter input. The amplifier 2–3 comprises a transistor 2, which is connected as a diode, which shunts the base-emitter path of a transistor 3 and thus represents a known type of current mirror arrangement with a low input impedance.

In the scope of the invention the term "current mirror" is to be understood to mean a device which comprises at least a first transducer, which converts a current flowing through it into a voltage which is a non-linear (generally logarithmic) function of this current, which first transducer is coupled to a second transducer, which re-converts said voltage into a current which is a non-linear (generally exponential) function of said voltage. The input current of the current mirror can pass through the first transducer (diode 2 in FIG. 3) after which the second transducer (transistor 3 in FIG. 3) provides the output current of the current mirror. However, the output current of the current mirror may also pass through the first transducer (diode 2) and the input current through the second transducer (3) (as is shown in the variant of FIG. 4), after which the entire circuit is included in a negative-feedback loop of a further amplifier (4).

Figure 4:
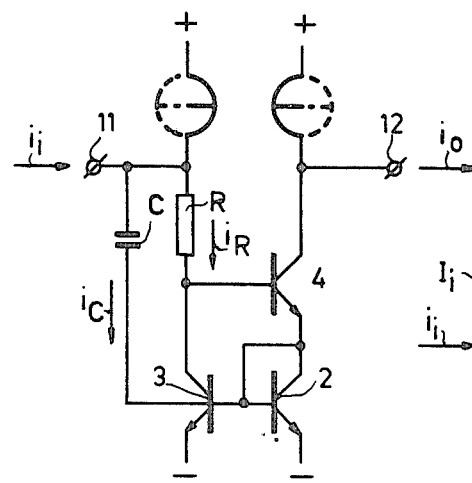

In FIG. 4 the input signal current $i_i$ is again applied to two parallel branches. The first branch comprises a resistor R and now terminates in an inverted current amplifier in the form of an improved current mirror, known per se, with the transistor 2, which is connected as a diode, in parallel with the emitter-base path of the transistor 3, whose collector-base path is shunted by the base-emitter path of a transistor 4. The signal component current $i_R$ through said first branch is consequently duplicated in the collector of the transistor 4. The second branch comprises the capacitor C and terminates at the connection between the base of transistor 3 and emitter of transistor 4.

Consequently, this transistor 4 again functions as the non-inverting current amplifier for the signal component current $i_C$ through the second branch and the output current $i_o$ of transistor 4 consequently becomes $= i_C \cdot i_R$. A similar effect is obtained, if the capacitor C and the resistor R are interchanged.

In the ideal case the output current $i_o$ as a function of the input current $i_i$ in FIGS. 3 and 4 respectively, is given by $$\frac{i_o}{i_i} = \frac{1 - pRC}{1 + pRC} \text{ and } -\frac{1 - pRC}{1 + pRC}$$

respectively. However, at high frequencies this expression is no longer satisfied exactly. Since each of the two branches comprises an individual amplifier, it has become possible to select the current gains of these branches differently. When these current gains at low frequencies are designated $a_o$ and $b_o$ respectively, then $(i_o/i_i)$ may be written as $$\frac{i_o}{i_i} = \frac{a}{1 + pRC} - \frac{bpRC}{1 + pRC}$$

where $$a = \frac{a_o}{1 + p\tau_a} \text{ and } b = \frac{b_o}{1 + p\tau_b},$$

in which $\tau_a$ and $\tau_b$ represent time constants, which are representative of the high-frequency behaviour of the transistors in the first (1 in FIG. 3; 2, 3, 4 in FIG. 4) and the second amplifier (2, 3 in FIG. 3; 4 in FIG. 4) respectively.

If for the sake of convenience $a_o$ is assumed to have the value 1, a substantial improvement of the high-frequency behaviour of the section can be obtained by the choice $b_o = 1 - (a/RC)$. The following expression is then valid in a first approximation:

$$\frac{i_o}{i_i} \approx \frac{1 - p\tau_a}{1 + pRC} - \frac{pRC}{1 + pRC} + \frac{p\tau_a}{1 + pRC} + \frac{p^2 RC \tau_b}{1 + pRC} - \frac{p^2 \tau_a \tau_b}{1 + pRC} \approx \frac{1}{1 + pRC} - \frac{pRC}{1 + pRC}.$$

Furthermore, allowance is to be made for the internal resistance r of the diode 2 in FIG. 3, as a result of which the transfer function of the section changes to:

$$\frac{i_o}{i_i} = a \frac{1 + prC}{1 + p(R + r)C} - b \frac{pRC}{1 + p(R + r)C}.$$

This effect can be corrected by (for $a = 1$) selecting for $b = 1 + (2r/R)$. If furthermore the parasitic capacitance c is taken into account, which the input terminal 11 of the section exhibits relative to the substrate of a semiconductor body on which the sections are integrated, it is again found to be possible to correct this by selecting for b (at $a = 1$): $b_o = 1 + (c/C)$.

All in all the gain factor $b_o$ can be adjusted so by adding the various above-mentioned differences between $b_o$ and the value 1, that a common correction for all the above-mentioned undesired effects is obtained. In theory, this could be realized by giving the current mirror 2–3 in FIG. 3 a mirror ratio (ratio of the output current to the input current) which differs from 1, for example by selecting the emitter areas of the transistors 2 and 3 differently. However, in practice it is found desirable to render the value of $b_o$ also adjustable, not only because of the spread of the transistor parameters, but also because in the case of a variation of the quiescent-current settings of the transistors, for example in order to change the drive range or signal handling capacity of the filter, the transistor parameters and thus the correction needed for $b_o$ may change.

Figure 5:
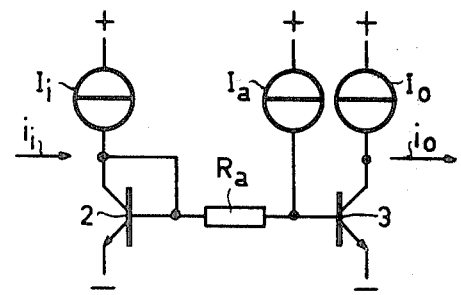
FIG. 5 shows a special current mirror circuit which is to be used in particular in the capacitive branch of such a section.

FIG. 5 shows a simple current arrangement by means of which this adjustment $b_o$ can be obtained. For this purpose a low resistance $R_a$ is included between the diode 2 and the transistor 3 of FIG. 3, across which a voltage is produced with the aid of an adjustable current source $I_a$, which voltages, added to the voltage across the diode 2, acts on the base of the transistor 3 and consequently determines the mirror ratio of the current mirror 2–3. If then a setting is selected for the current source $I_o$ which is such that when $i_C = 0$, also $i_o = 0$, the mirror ratio $(i_o/i_C)$ is found to vary exponentially with the bias current $I_a$.

Figure 6:
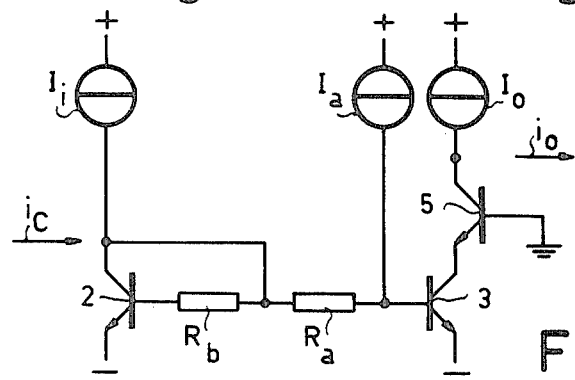
FIG. 6 shows an improvement of the circuit in accordance with FIG. 5.

A drawback of the circuit arrangement in accordance with FIG. 5 is, inter alia, that for high frequencies negative feedback is produced via the internal collector-base capacitance of the transistor 3. This can simply be compensated for in accordance with FIG. 6 by means of an additional transistor 5 in series with transistor 3, whose base is connected to a point of constant potential (cascade circuit).

The capacitance $C_{be3}$ between the base of transistor 3 and ground also has an adverse effect on the high frequency behaviour. This capacitance is constituted by the internal base-emitter capacitance of the transistor 3 and by the capacitance of the current source $I_a$ with respect to ground. However, it is now found that by connecting transistor 2 not as a pure diode, but by including a low resistance $R_b$ in its base circuit and connecting its collector to the junction point of $R_a$ and $R_b$, said effect can be compensated for, utilizing the capacitance $C_{be2}$ between the base and emitter of transistor 2. The requirement for full compensation is then found to be $R_a C_{be3} = R_b C_{be2}$.

Generally it is desirable that the delay time ($= 2RC$) of each section is adjustable. In theory, variable capacitors may be considered; these capacitors may for example be realized as reverse-biased pn-diodes and a similar variation of the capacitance value of the capacitors (i.e. the diodes) in the various sections can then be obtained by applying a variable voltage to a line which is common to the diodes. However, means for varying the effective value of R are to be preferred, so that the capacitive branch can be proportioned for maximum bandwidth.

Figure 7:
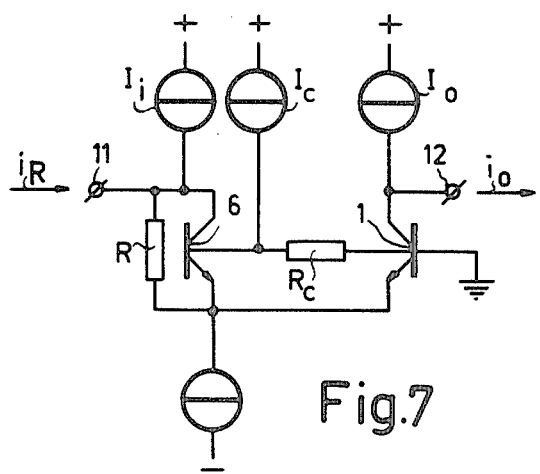
FIG. 7 is an example of the resistive branch of such a section comprising means for varying the effective resistance value.

FIG. 7 shows a circuit arrangement for adjusting the effective resistance value. The resistor R is shunted by transistor 6, to whose base a variable voltage is applied with the aid of a variable current source $I_c$ and a resistor $R_c$ of low value. The transistor 1 again constitutes the same non-inverting amplifier as in FIG. 3. The input current $i_R$ (of the resistive branch) flows through the parallel connection of the resistor R and the transistor 6 and via the emitter-collector path of the transistor 1 to the output 12, so that $i_o$ is substantially equal to $i_R$.

In respect of the effective resistance value, the parallel connection of R and transistor 6 constitutes an impedance, which increases exponentially with the current setting of the source I. This is because the base of transistor 6 is virtually connected to ground for signal voltages, resulting in negative signal feedback via its emitter.

Figure 8:
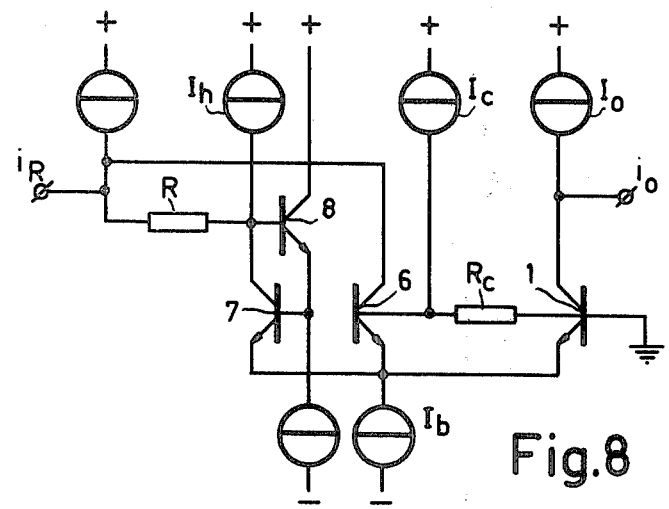
FIG. 8 shows a further improvement of the circuit in accordance with FIG. 7.

Furthermore, in order to obtain a correction for the base currents of the transistor 1 and 6, the transistors 7 and 8 are included in accordance with FIG. 8, which transistors can be biased in such a way with the aid of the current source $I_h$ that no direct current flows through the resistor R. For this purpose a bridge of current sources $I_a$ and $I_b$ has been included. The source $I_b$ is preferably adjusted to a current which is twice as high as that of the source $I_h$.

Figure 9:
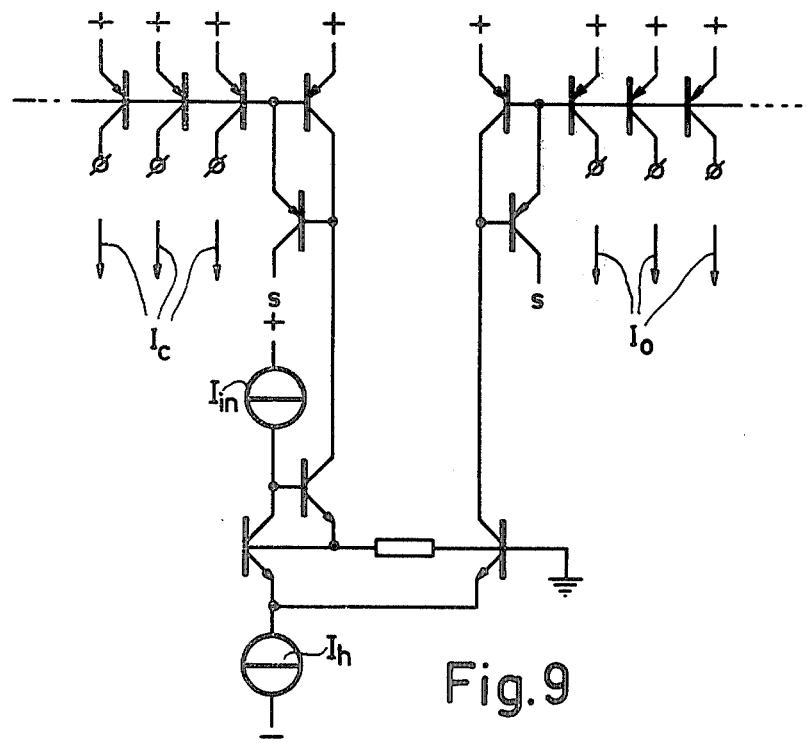
FIG. 9 shows a circuit which reduces the originally exponential character of the effective-resistance control in accordance with FIGS. 7 and 8.

The current sources required for each of the sections are preferably coupled to each other, so that by means of a single setting it is ensured that all currents vary to the same degree and the delay times of the sections greatly correspond to each other. Coupled current sources are known per se. FIG. 9 shows an example of the manner in which the sources $I_c$ and $I_o$ (FIGS. 7 and 8) can be controlled simultaneously by sources $I_{in}$ and $I_h$, insuch a way that the exponential control of the effective resistance per section is simplified: $R_{eff}=R/(1-I_{in}/I_h)$.

Figure 10:
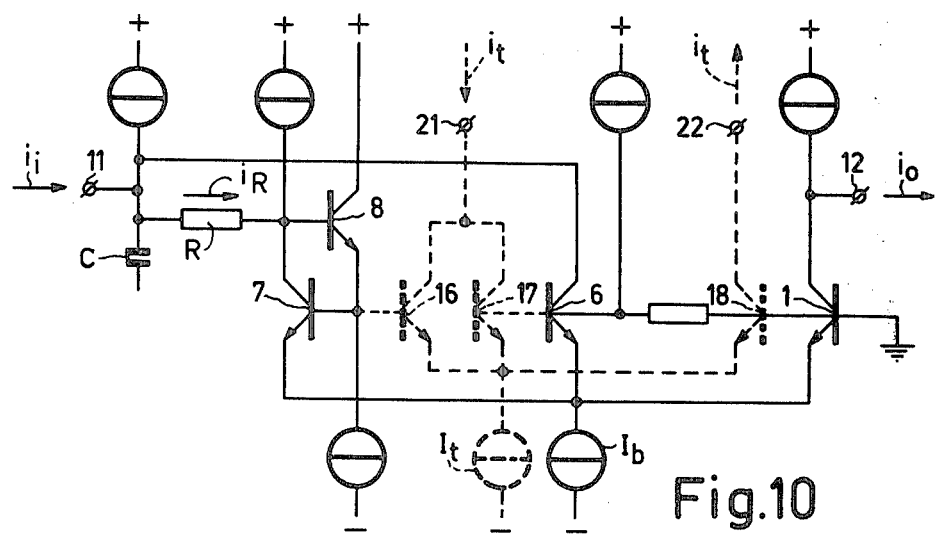
FIG. 10 shows a further extension of FIG. 8, which also comprises a tapping for transversal-filter operation.

The tappings and weighting factor adjusting means ($w_o \ldots w_n$ in FIG. 1) required for transversal filter operation can simply be incorporated in the amplifier included in the (first) branch with a resistive character. For this purpose FIG. 10 shows an extension of FIG. 8, corresponding elements bearing the same designations. The extension consists of the additional transistors 16, 17 and 18 and the current source $I_t$. The input signal current $i_i$ of the section applied to the input terminal 11 again divides over the first branch with the resistor R and the second branch with the capacitor C (which is assumed to be extended in accordance with FIGS. 5 and 6). The output current $i_o$ of the first branch (to which that of the second branch is to be added) is taken from the output electrode 12 of the section. The tapping current $i_t$ of the section appears balanced on the electrodes 21 and 22. The differential signal current $i_t$ on the last-mentioned electrodes is given by the formula $i_t = (I_t/i_b) i_R$ where $i_R$ is again the signal component current for the first branch. This formula reveals that the magnitude of the tapped current can simply be adjusted by setting the current source $I_t$. This setting may have a fixed value, but for versatility (flexibility) of the transversal filter an electrical adjusting facility may be desirable. This may for example be obtained in known manner with the aid of a programmable read only memory (PROM). Furthermore $i_R = i_i/1+pRC$, so that $$i_t = \frac{I_t}{I_b} \frac{i_i}{1+pRC},$$

which shows that the low-pass section $s_o$ (FIG. 1) becomes redundant, because its function is automatically incorporated in the branches. The transversal filter now consists entirely of identical sections.

Figure 11:
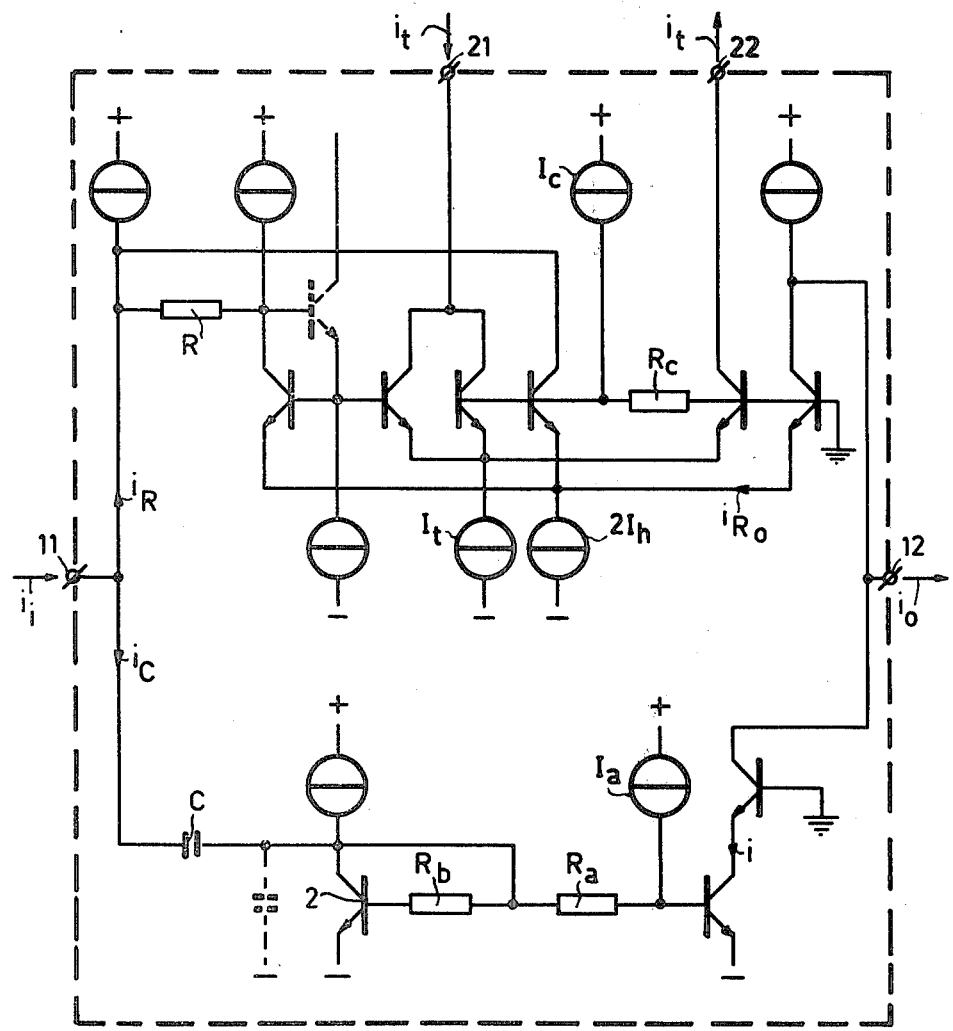
FIG. 11 shows an complete network section elaborated in accordance with the previously discussed principles.

FIG. 11 shows the overall circuit design of a filter section in accordance with the previously discussed principles. The input current $i_i$ of the section divides over a first branch (component current $i_R$) with a resistive element in accordance with FIG. 10 and a second branch (component current $i_C$) with a capacitive character in accordance with FIG. 6. The output current $i_o$ of the section, which is also the input current of the next section, is obtained by summation of the currents in the two sections. With the aid of the current sources $I_a$, $I_c$ and $I_h$ the necessary corrections can be obtained, while with the aid of the current source $I_t$ the intensity of the current $i_t$ on the tapping electrodes 21, 22 can be adjusted. In a practical embodiment the resistors $R_a$, $R_b$ and $R_c$ had values of 100, 200 and 200 Ohms respectively, the capacitor C was constituted by a nitride dielectric and had a value of 30 pF. The parasitic capacitance parallel to the transistor 2 was 10 pF.

Figure 12:
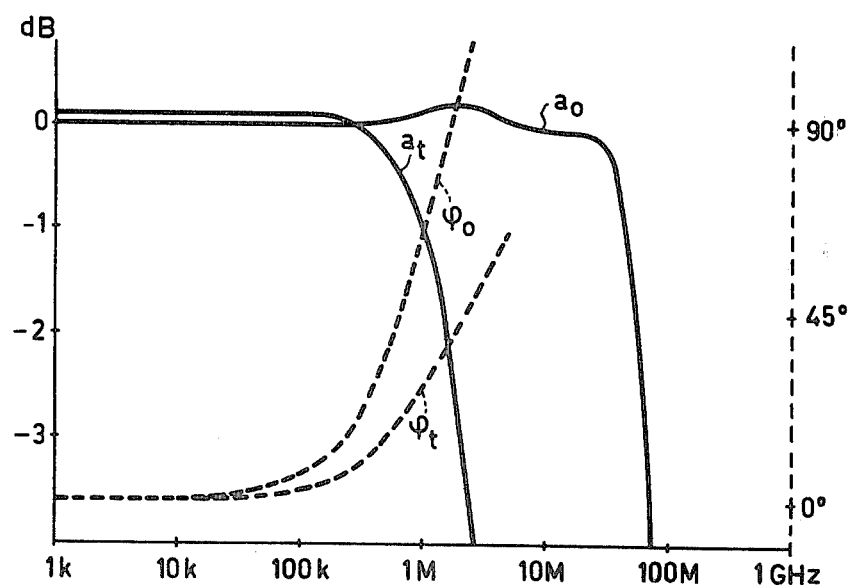
FIG. 12 shows examples of characteristics that can be measured on a transversal filter comprising such sections.

FIG. 12 shows an example of transfer characteristics as measured on a single section which is terminated in the correct manner. The amplitude response $a_o$ from the input 11 to the output 12 is substantially flat up to approximately 50 MHz, while the corresponding phase characteristic $Q_o$ already passes through the value 90° at approximately 2 MHz. The amplitude response $a_t$ and the phase response $Q_t$ at the tapping points 21 and 22 reveal that at this frequency the amplitude has dropped by 3 dB and the phase shift is 45°.

Figure 13:
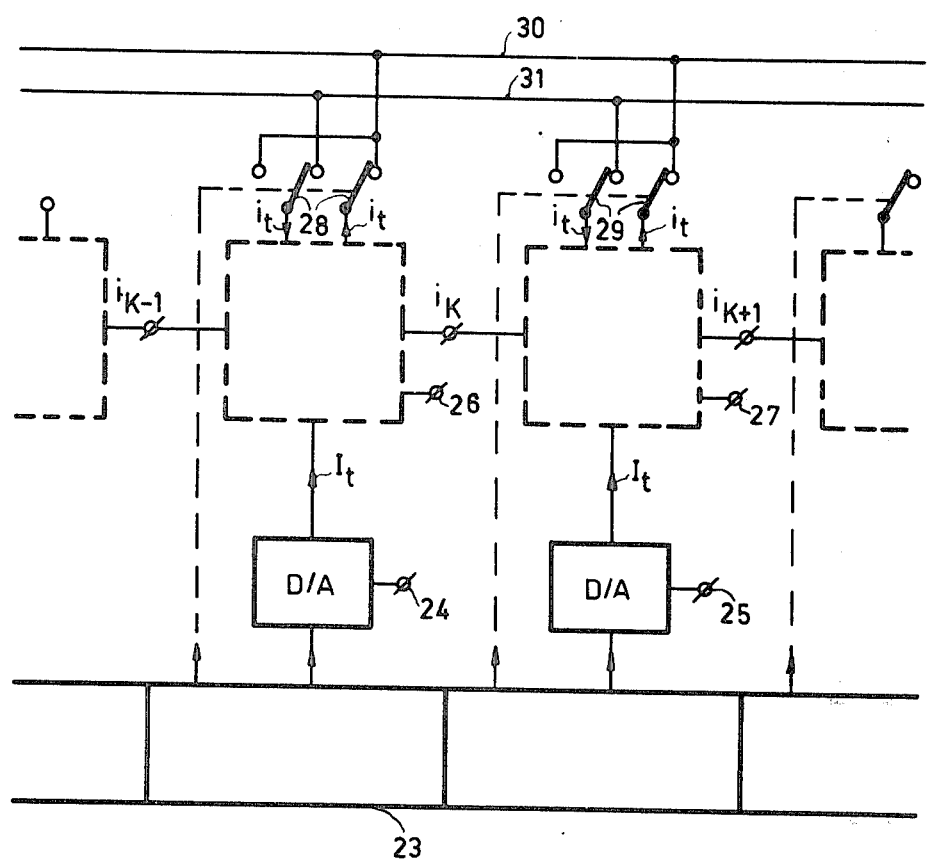
FIG. 13 shows the circuit arrangement of a programmable filter in accordance with these principles.

FIG. 13 shows the circuit arrangement of a programmable filter in accordance with the invention. A coefficient memory 23 controls digital-analog converters 24 and 25, which supply currents $I_t$ which determine the magnitude of the coefficients $a_k$ (FIG. 1) for the tappings on the cascaded delay sections 26, 27, . . . as shown in FIG. 11. The tapping currents $i_t$ can be applied to the busbars 30 and 31 with the desired polarity by means of the switches 28, 29, . . . The polarity switches are controlled by the sign bit of the coefficient in the coefficient memory. The analog section of the circuit may for example be realized by means of a stand linear bipolar integration process and the digital section may for example be realized in I$^2$L, together on one semiconductor body.

What is claimed is:
1. A Programmable filter comprising:
a chain of at least three all-pass sections having mutually substantially identical phase responses and substantially flat amplitude responses as a function of frequency at least up to a given frequency value;
tapping being provided on said chain of sections to which adjustable signals are applied and/or derived for adjusting the signal transfer characteristic of said programmable filter, said signals being adjustable with the aid of weighting factor adjusting means;
said all-pass sections being integrated on a semiconductor body;
each of said all-pass sections comprising:
a semiconductor amplifier circuit having first and second inputs and a common output;
a circuit comprising:
a resistor and a capacitor coupling an input terminal of said section to said first and second inputs in such manner that first and second signal paths having resistive and capacitive elements respectively connect said input terminal to said common output via said first and second inputs respectively;
the coupling from the input terminal of each section to the first input of the corresponding amplifier circuit including the corresponding resistor in series therewith;
the coupling from the input terminal of each section to the second input of the corresponding amplifier circuit including the corresponding capacitor in series therewith;

each amplifier circuit being inverting from one of its said inputs to its output and being non-inverting from the other of its said inputs to its output;

the input impedance of said amplifier circuit at each of its said inputs being negligibly small;

each amplifier circuit including a current mirror coupling one of its inputs to its output;

such that a signal applied to said input terminal will be split between said paths; and said amplifier circuit arrangement being constructed to exhibit negligible consumption of input signal power.

2. A filter as claimed in claim 1, wherein said current mirror comprises:

a first transistor;

a diode-equivalent connected in parallel with the base-emitter path of said first transistor;

a second transistor, the base-emitter path of which shunts the collector-base path of said first transistor;

said one input of said amplifier circuit being connected to the base of said second transistor;

said other input of said amplifier circuit being connected to the base of said first transistor; and the collector of said second transistor being connected to the common output of said amplifier circuit.

3. A filter as claimed in claim 1, wherein said current mirror comprises:

a first transistor;

a diode-equivalent connected in parallel with the base-emitter path of said first transistor;

a second resistor included in the connection from said didoe-equivalent to said first transistor;

said one input of said amplifier circuit being connected to said diode-equivalent; and the collector of said first transistor being connected to the output of said amplifier circuit.

4. A filter as claimed in claim 2, including a second resistor in the connection from said diode-equivalent to said first transistor.

5. A filter as claimed in claim 3, wherein said diode-equivalent comprises:

a further transistor, the collector and the emitter of which constitute respective terminals of said diode-equivalent;

the collector of said further transistor being connected to its base via a third resistor; and said second resistor being included between the collector of the further transistor and the base of said first transistor.

6. A filter as claimed in claim 4, wherein said diode-equivalent comprises:

a further transistor, the collector and the emitter of which constitute respective terminals of said diode-equivalent;

a third resistor;

the collector of said further transistor being connected to its base via a third resistor; and said second resistor being included between the collector of the further transistor and the base of said first transistor.

7. A filter as claimed in claim 1, wherein each section includes:

an additional transistor, the collector-emitter path of which is connected in parallel with said first resistor; and a controllable current source connected to the base of said additional transistor for controlling conduction in said additional transistor.

8. A filter as claimed in claim 6, wherein the direct current through said first resistor is compensated for by a bridge of current sources.

9. A filter as claimed in claim 7, wherein the controllable current sources included in the various sections are intercoupled so that they are controllable simultaneously and to the same degree by means of a single control signal.

* * * * *